(12) United States Patent
Lee et al.

(10) Patent No.: US 12,266,587 B2
(45) Date of Patent: Apr. 1, 2025

(54) SEMICONDUCTOR DEVICE AND METHOD FOR ADVANCED THERMAL DISSIPATION

(71) Applicant: STATS ChipPAC Pte. Ltd., Singapore (SG)

(72) Inventors: SeungHyun Lee, Incheon (KR); HeeSoo Lee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 414 days.

(21) Appl. No.: 17/805,951

(22) Filed: Jun. 8, 2022

(65) Prior Publication Data

US 2023/0402343 A1    Dec. 14, 2023

(51) Int. Cl.
*H01L 23/367* (2006.01)
*H01L 23/373* (2006.01)
*H01L 23/522* (2006.01)

(52) U.S. Cl.
CPC ........ *H01L 23/3675* (2013.01); *H01L 23/373* (2013.01); *H01L 23/5225* (2013.01)

(58) Field of Classification Search
CPC ... H01L 23/373; H01L 21/4882; H01L 21/56; H01L 23/315; H01L 25/50
See application file for complete search history.

(56) References Cited

U.S. PATENT DOCUMENTS

| | | |
|---|---|---|
| 6,964,889 B2 | 11/2005 | Ma et al. |
| 10,566,298 B2 | 2/2020 | Dalmia et al. |
| 10,636,774 B2 | 4/2020 | Yang et al. |
| 2007/0296079 A1 | 12/2007 | Huang et al. |
| 2016/0128179 A1* | 5/2016 | Okamoto ............. H04B 1/3827 29/832 |
| 2019/0051989 A1 | 2/2019 | Kim et al. |
| 2021/0028122 A1 | 1/2021 | Son et al. |
| 2021/0091017 A1 | 3/2021 | Yeon et al. |
| 2021/0366838 A1 | 11/2021 | Han et al. |
| 2022/0173082 A1* | 6/2022 | Kim .................... H01L 23/5389 |

\* cited by examiner

*Primary Examiner* — Samuel A Gebremariam
(74) *Attorney, Agent, or Firm* — Brian M. Kaufman; Robert D. Atkins; PATENT LAW GROUP: Atkins and Associates, P.C.

(57) ABSTRACT

A semiconductor device has a substrate and a semiconductor die disposed over the substrate. A tape is disposed over the semiconductor die. An encapsulant is deposited over the substrate, semiconductor die, and tape. The tape is removed to leave a cavity in the encapsulant over the semiconductor die. A shielding layer is formed over the encapsulant and semiconductor die. A heat spreader is disposed over the shielding layer. The heat spreader includes a protrusion extending into the cavity of the encapsulant.

23 Claims, 10 Drawing Sheets

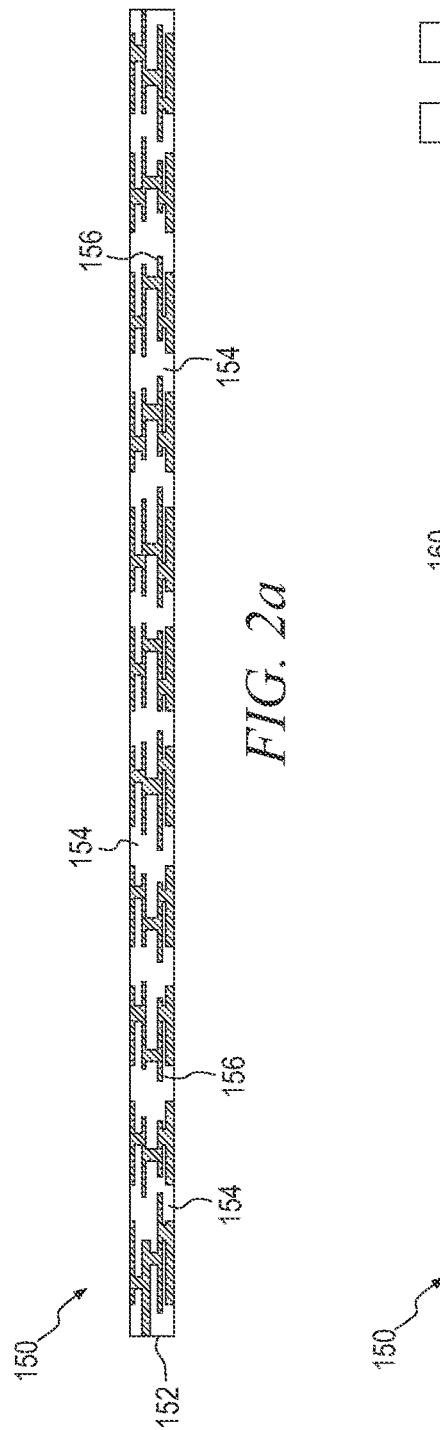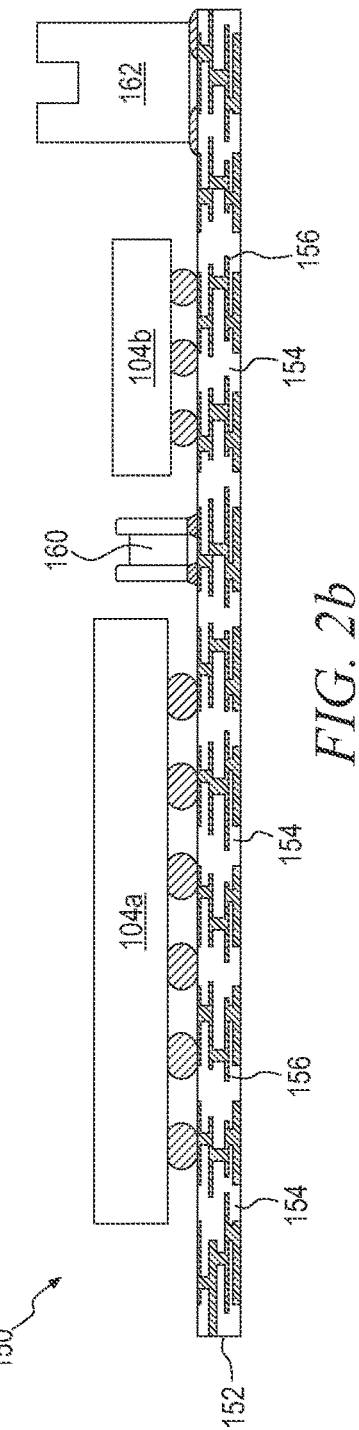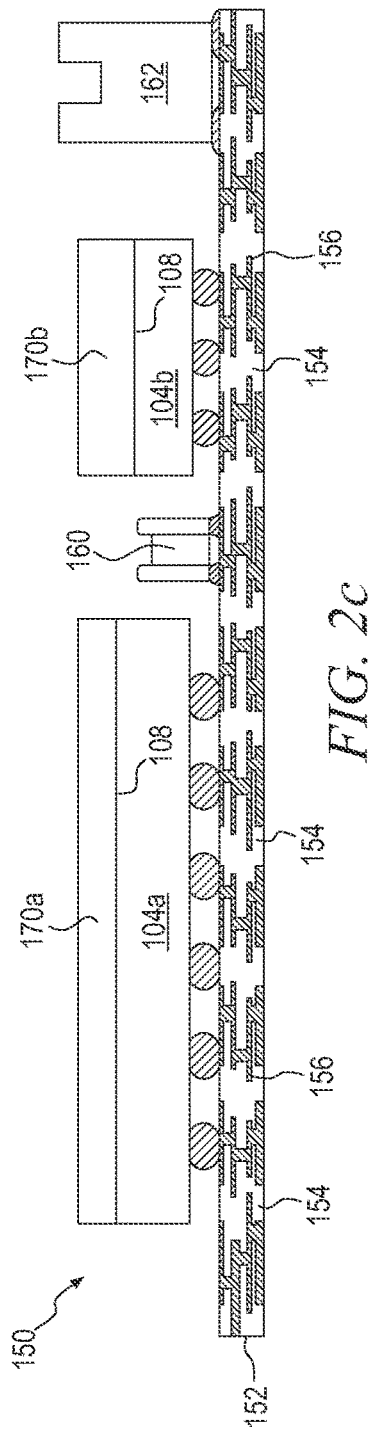

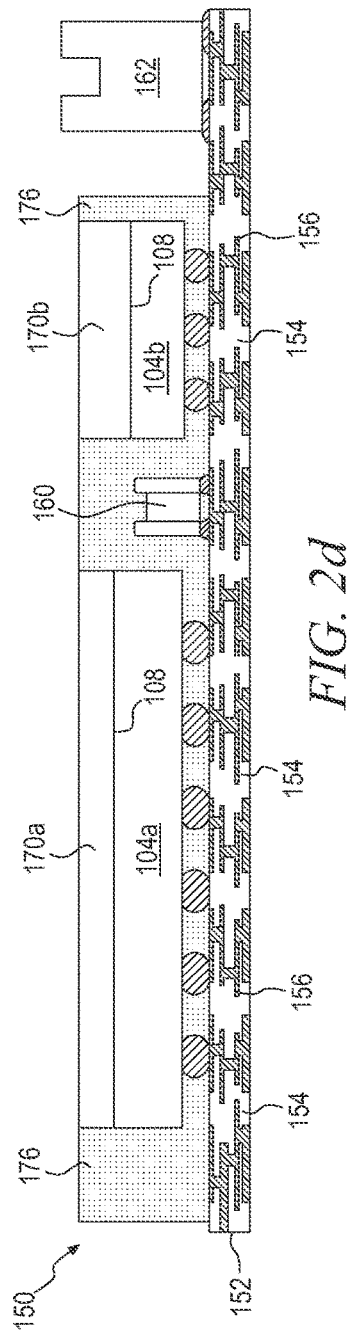
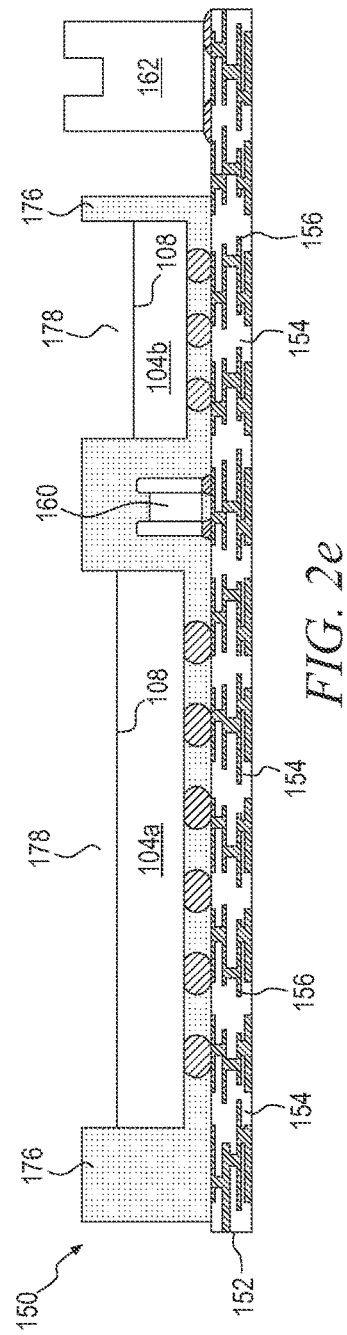
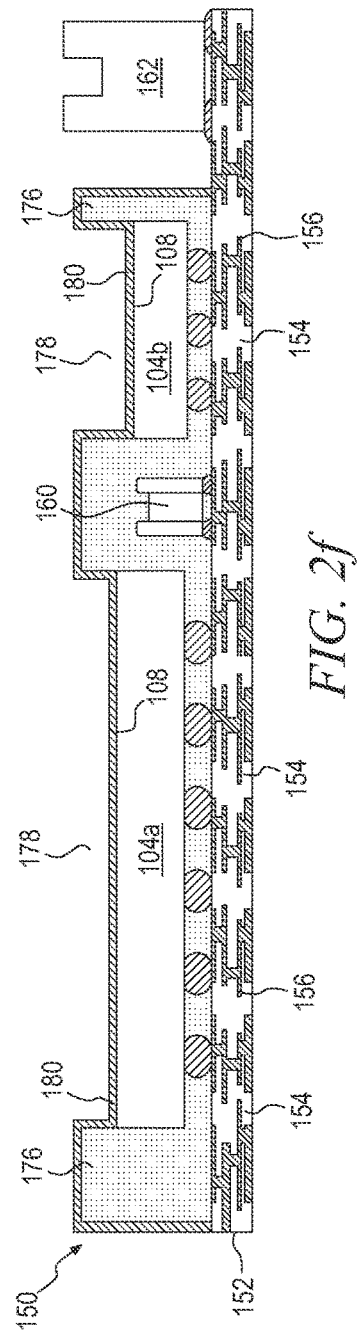

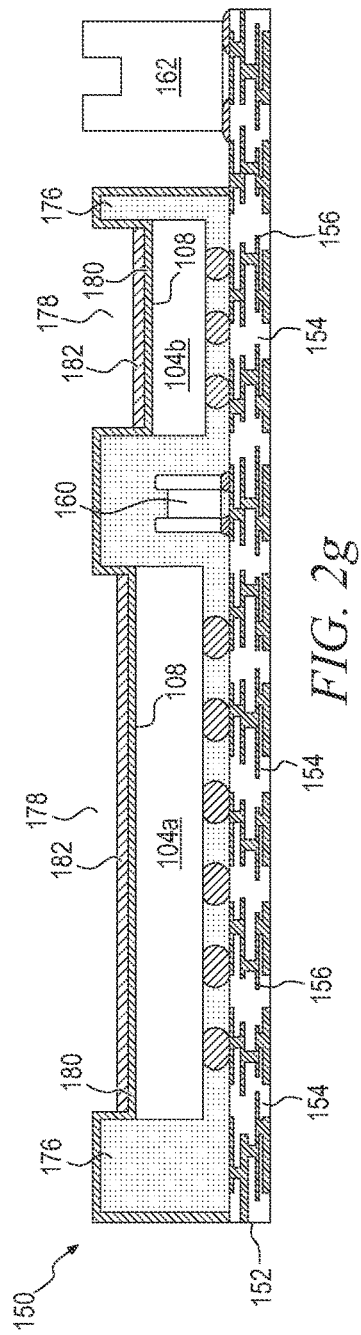
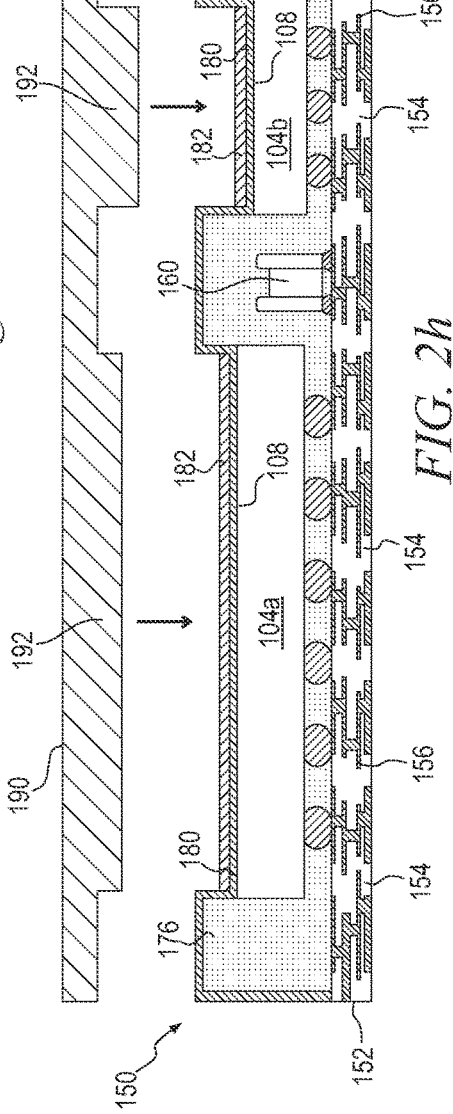
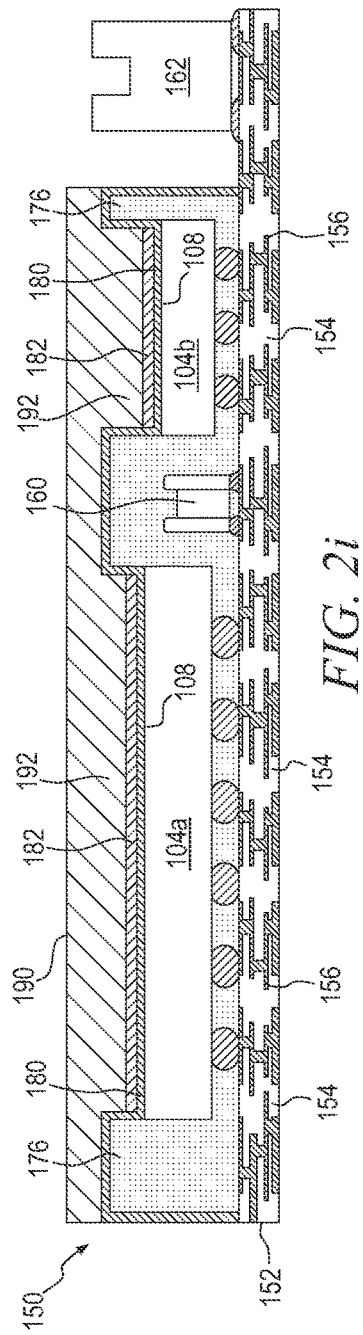

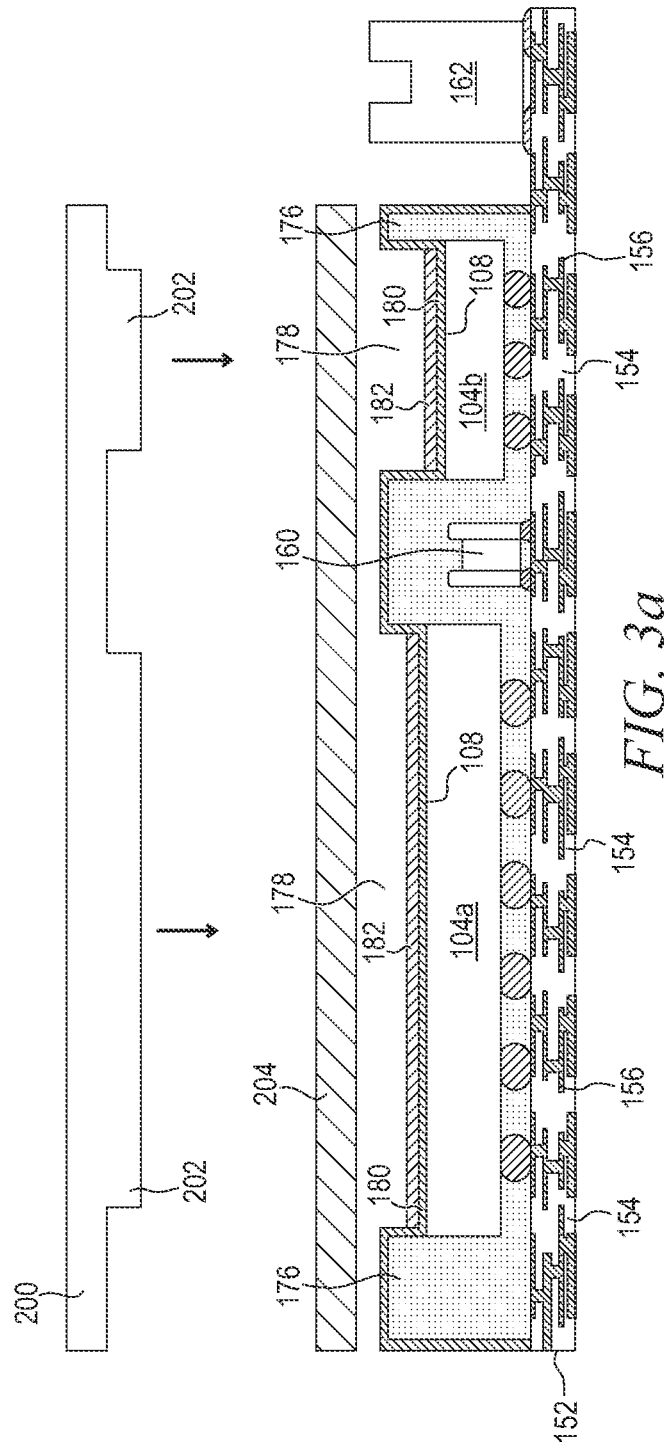
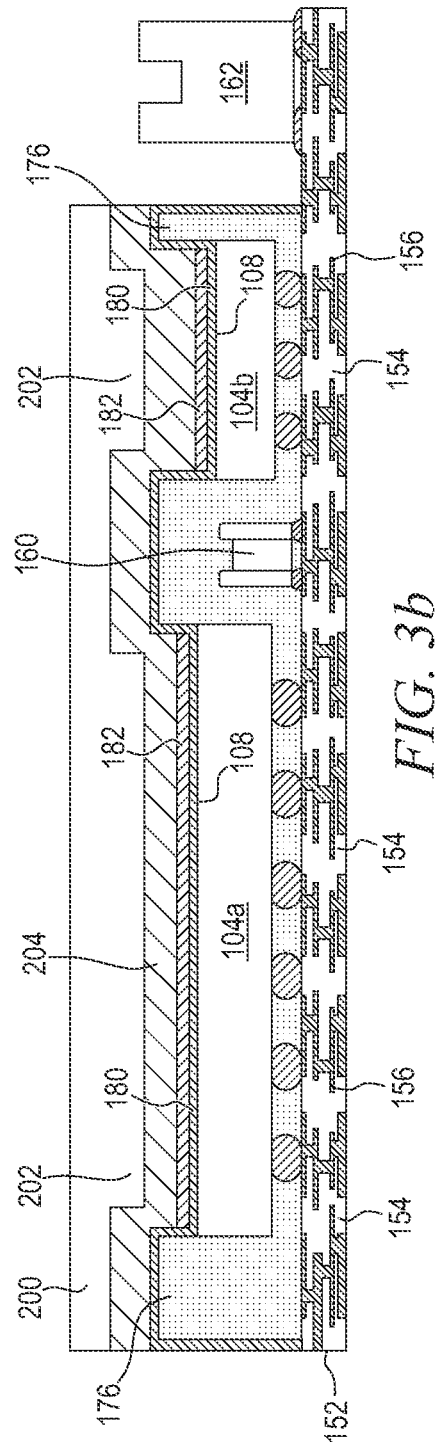
FIG. 3a
FIG. 3b

SEMICONDUCTOR DEVICE AND METHOD FOR ADVANCED THERMAL DISSIPATION

FIELD OF THE INVENTION

The present invention relates in general to semiconductor devices and, more particularly, to a semiconductor device and method for advanced thermal dissipation.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Handling the thermal output of semiconductor devices is a major concern of semiconductor manufacturing. Packages commonly have heat spreaders or heatsinks attached to help dissipate heat. For modern package types, as interface pitches and package thicknesses are reduced and pin counts are increased, more heat is generated during operation. Therefore, a need exists for new methods and devices to efficiently dissipate heat generated by a semiconductor package.

BRIEF DESCRIPTION OF THE DRAWINGS

FIGS. 2a-2i illustrate forming a system-in-package (SiP) module with a stepped heat spreader;

FIGS. 3a-3c illustrate forming the stepped heat spreader by pressing a flat plate;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structure. An encapsulant or other molding compound is deposited over the package to provide physical support and electrical isolation. The finished package is then inserted into an electrical system and the functionality of the semiconductor device is made available to the other system components.

Figure 1A:
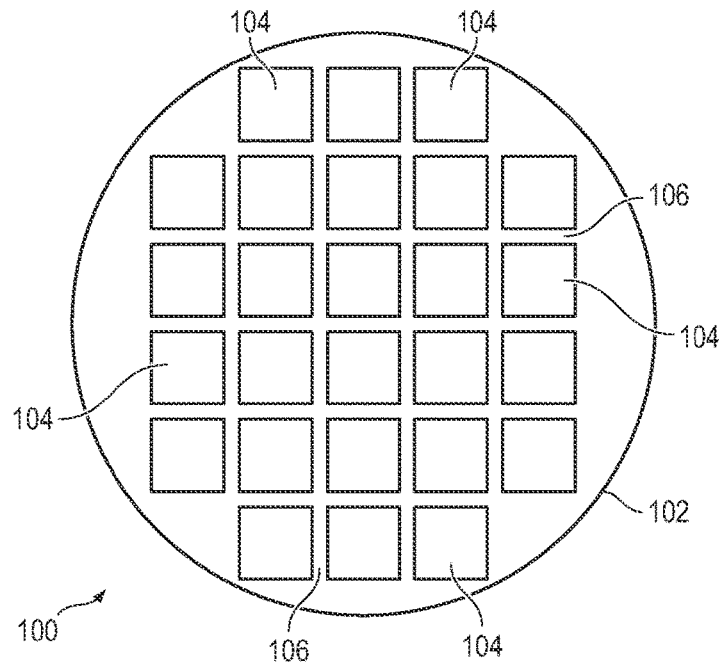
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
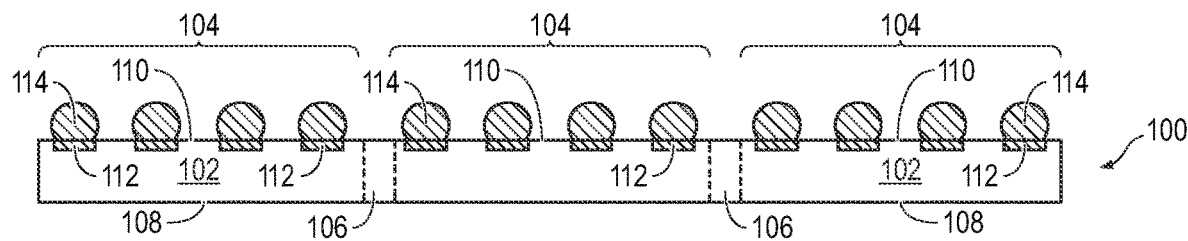

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using physical vapor deposition (PVD), chemical vapor deposition (CVD), electrolytic plating, electroless plating, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1B. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents the last conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

An electrically conductive bump material is deposited over conductive layer 112 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. The bump material can be reflowed by heating the material above its melting point to form conductive balls or bumps 114. In one embodiment, conductive bumps 114 are formed over an under bump metallization (UBM) having a wetting layer, barrier layer, and adhesion layer. Conductive bumps 114 can also be compression bonded or thermocompression bonded to conductive layer 112. Conductive bumps 114 represent one type of interconnect structure that can be formed over conductive layer 112 for electrical connection to a substrate. The interconnect structure can also use bond wires, conductive paste, stud bump, micro bump, conductive pillars, or other electrical interconnect.

Figure 1C:
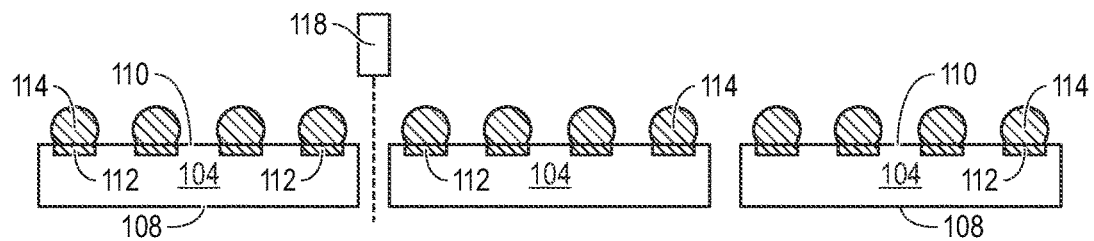

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post-singulation.

FIGS. 2a-2i illustrate forming a system-in-package (SiP) device 150 with multiple semiconductor die 104 and a stepped heat spreader.

FIG. 2a shows a partial cross-sectional view of a substrate 152. While only a single substrate 152 is shown, hundreds or thousands of substrates are commonly processed on a common carrier, using the same steps described herein for a single unit but performed en masse. Substrate 152 could also start out as a single large substrate for multiple units, which are singulated from each other during or after the manufacturing process.

Substrate 152 includes one or more insulating layers 154 interleaved with one or more conductive layers 156. Insulating layer 154 is a core insulating board in one embodiment, with conductive layers 156 patterned over the top and bottom surfaces, e.g., a copper-clad laminate substrate. Conductive layers 156 also include conductive vias electrically coupled through insulating layers 154. Substrate 152 can include any number of conductive and insulating layers interleaved over each other. A solder mask or passivation layer can be formed over either side of substrate 152. Any suitable type of substrate or leadframe is used for substrate 152 in other embodiments.

FIG. 2b shows SiP device 150 being formed on substrate 152. Substrate 152 has had semiconductor die 104a and 104b mounted thereon, as well as any discrete active or passive components, semiconductor die, or other components desired for the intended functionality. Semiconductor die 104a and 104b can be identical die singulated from a common semiconductor wafer 100, or different die from different wafers with cooperative functionality, e.g., a processor and a memory or transceiver IC. Only a single semiconductor die 104 is used in other embodiments. Any number, type, and combination of semiconductor die and other electrical components can be used to make SiP module 150.

A discrete component 160 and board-to-board (B2B) connector 162 are mounted to substrate 152 along with semiconductor die 104. Solder paste is used to electrically and mechanically couple discrete component 152 and B2B connector 162 to conductive layer 156. Any combination of discrete active and passive components can be mounted as desired, e.g., to implement a radio frequency (RF) filter. B2B connector 162 is used to attach a ribbon cable or another type of electrical conduit to SiP module 150 to allow other packages to communicate with, and utilize the functionality of, semiconductor die 104. Semiconductor die 104 are connected to B2B connector 162 and each other through conductive layer 156.

In FIG. 2c, a tape 170 is attached to back surfaces 108 of semiconductor die 104. Tape 170a is attached onto semiconductor die 104a and tape 170b is attached onto semiconductor die 104b. Tape 170 is an ultraviolet release tape, thermal release tape, multi-layer tape, or another suitable type of tape. Tape 170 is formed from polyimide (PI) or another suitable polymer in one embodiment. Tape 170 adheres onto the back surfaces of semiconductor die 104 using an adhesive. In some embodiments, different thicknesses of tape 170 are used for each semiconductor die 104, with taller semiconductor die having thinner tape and shorter semiconductor die having thicker tape, such that the top surface of tape 170a is approximately coplanar to the top surface of tape 170b.

In FIG. 2d, an encapsulant or molding compound 176 is deposited over substrate 152, covering top and side surfaces of semiconductor die 104. Encapsulant 176 also extends under semiconductor die 104 between the semiconductor die and substrate 152. In other embodiments, a separate mold underfill (MUF) is used instead.

Encapsulant 176 is an electrically insulating material deposited using a paste printing, compressive molding, transfer molding, liquid encapsulant molding, vacuum lamination, spin coating, or other suitable application process. Encapsulant 176 can be polymer composite material, such as an epoxy resin, epoxy acrylate, or polymer with or without a filler. Encapsulant 176 is non-conductive and environmentally protects the semiconductor device from external elements and contaminants.

A top surface of encapsulant 176 is made coplanar to the top surfaces of tape 170 by utilizing film-assisted molding or another suitable molding technique. In some embodiments, tape 170 is compressible and compressed during molding to ensure that the top surfaces of tape 170 are coplanar during molding even if the tape expands over the top of encapsulant 176 after SiP module 150 is removed from the mold. Top surfaces of tape 170 being coplanar while molding provides a flat and horizontal top surface of encapsulant 176 with clean cavities 178 once the tape is removed but is not absolutely necessary. In other embodiments where the top surfaces of tape 170 are not all coplanar, encapsulant 176 is deposited over the top of all tape 170 and then etched or backgrinded to make all top surfaces coplanar.

B2B connector 162 remains outside of encapsulant 176 by utilizing a removable lid that can be removed after encapsulation or by using a mold that protects the B2B connector within a non-molding compartment. Encapsulant 176 is typically deposited with substrate 152 remaining as a larger panel with multiple SiP modules 150 being formed at once. The larger panel of substrate 152 and encapsulant 176 is then singulated after manufacturing is complete.

In FIG. 2e, tape 170 is removed by mechanical peeling to expose the top surfaces of semiconductor die 104 recessed within cavities 178 of encapsulant 176. Tape 170 can be removed by mechanical peeling in combination with thermal or UV release as appropriate for the type of tape and adhesive being used. In some embodiments, tape 170 is removed as an inherent part of the molding process, e.g., by the tape adhering to the top chase of the mold such that the tape is removed when the mold is opened.

Cavities 178 are created by tape 170 displacing encapsulant 176. Therefore, cavities 178 have substantially the same footprint size and shape as tape 170 and semiconductor die 104. The pieces of tape 170 can be made larger or smaller than semiconductor die 104 to create cavities 178 that have larger or smaller footprints than the semiconductor die.

In FIG. 2f, a conductive material is sputtered over SiP module 150 to form a conductive shielding layer 180. Shielding layer 180 is formed using any suitable metal deposition technique, e.g., PVD, CVD, other sputtering methods, spraying, or plating. The sputtered material can be copper, steel, aluminum, gold, combinations thereof, or any other suitable conductive material. In some embodiments, shielding layer 180 can be made by sputtering on multiple layers of differing material, e.g., stainless steel-copper-stainless steel or titanium-copper.

Shielding layer 180 reduces EMI between the components of SiP module 150 and other nearby electronic devices. Shielding layer 180 is optionally connected to a ground voltage node through conductive layers 156 to improve EMI reduction. Shielding layer 180 can be connected to conductive layer 156 by sputtering the shielding layer onto an exposed side surface of substrate 152 where the conductive layer is exposed. B2B connector 162 remains outside of shielding layer 180 by sputtering the shielding layer while the B2B connector is protected by a lid or can. Shielding layer 180 is formed directly on back surfaces 108 of semiconductor die 104 and also covers top and side surfaces of encapsulant 176.

In FIG. 2g, a thermal interface material (TIM) 182 is deposited into cavities 178 on shielding layer 180. TIM 182 can be any suitable thermally transmissive material, such as thermal paste, thermal adhesive, thermally conductive pads, or a metal-based TIM. In one embodiment, solder is used as TIM 182. TIM 182 can be applied as a solder paste.

A stepped heat spreader 190 is disposed over SiP module 150 in FIG. 2h. Heat spreader 190 includes protrusions 192 that align to cavities 178. Protrusions 192 each include a width and shape the same or slightly smaller than a corresponding cavity 178 so that the protrusions will fit within the cavities with a high contact surface area with semiconductor die 104 via shielding layer 180. Heat spreader 190 is referred to as stepped because the different thicknesses within and without the footprints of cavities 178 results in a stair-step-like appearance of the heat spreader.

In FIG. 2i, heat spreader 190 is placed down on top of encapsulant 176 such that protrusions 192 extend into cavities 178 and physically contact TIM 182. Heat spreader 190 physically contacts shielding layer 180 outside of cavities 178 in some embodiments. In other embodiments, a gap remains between heat spreader 190 and shielding layer 180. TIM 182 can be reflowed in embodiments where solder is used, which mechanically couples heat spreader 190 to shielding layer 180. TIM 182 extends from shielding layer 180 to heat spreader 190 to transfer thermal energy from semiconductor die 104 to the heat spreader. In some embodiments, protrusions 192 are pressed into TIM 182 such that a portion of the TIM flows between side surfaces of the protrusions and side surfaces of shielding layer 180. Using a stepped heat spreader 190 results in the heat spreader getting closer to semiconductor die 104, and therefore thermal energy is transferred to the heat spreader more efficiently.

An additional heat sink can be attached at a later manufacturing step. Solder bumps or another interconnect structure can be formed on the bottom of substrate 152 to integrate SiP module 150 into a larger system. If formed as a larger panel, substrate 152 is singulated to separate a plurality of SiP modules 150 from each other. Individual SiP modules 150 are picked and placed into a tape and reel for delivery or directly onto the PCB or other substrate of a larger electrical system.

Figure 3C:
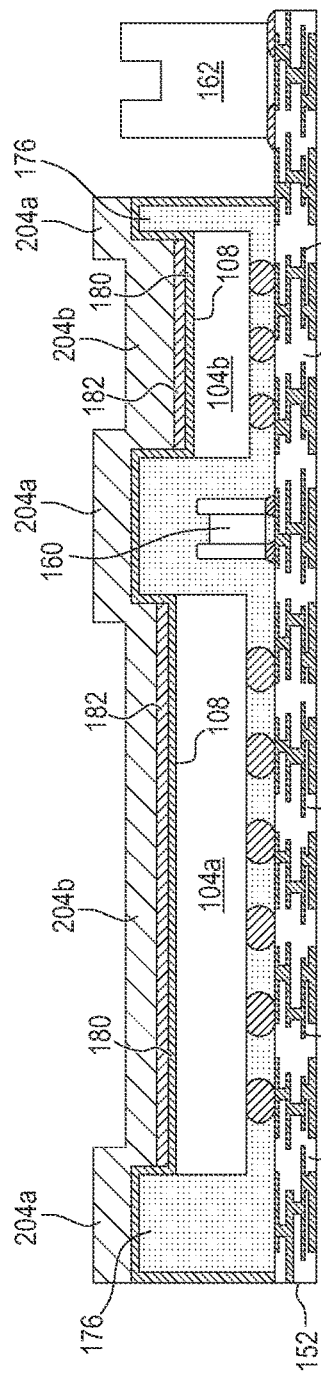

FIGS. 3a-3c illustrate using a stepped stamp 200 with protrusions 202 to stamp a flat heat spreader 204 into cavities 178. FIG. 3a shows flat heat spreader 204 disposed over encapsulant 176 with cavities 178. Stamp 200 is disposed over heat spreader 204 with protrusions 202 aligned to cavities 178. Stamp 200 is pressed down onto heat spreader 204 in FIG. 3b to shape or bend the heat spreader into cavities 178. Protrusions 202 of stamp 200 may or may not extend into cavities 178 depending on the specific dimensions of the cavities, the stamp, and heat spreader 204. Stamp 200 is removed to leave heat spreader 204 shaped to the top surface of encapsulant 176 with cavities 178 in FIG. 3c. Portions 204a of heat spreader 204 remain on the taller portions of encapsulant 176 while portions 204b have been pressed down into cavities 178 closer to semiconductor die 104. Heat spreader 204 is in a bent state to extend into cavities 178. Heat spreader 204 will typically have curved edges between areas 204a and 204b, rather than the sharp angles shown in FIG. 3c, but the specific shape will vary widely between different embodiments. TIM 182 is reflowed if necessary to mechanically and thermally connect heat spreader 204 to semiconductor die 104.

Figure 4A:
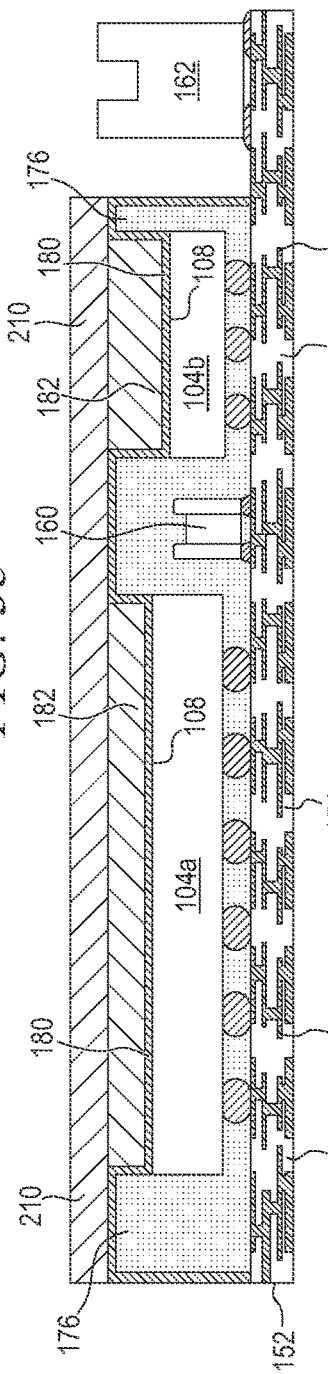
FIGS. 4a and 4b illustrate a flat heat spreader used over a stepped package body.
Figure 4B:
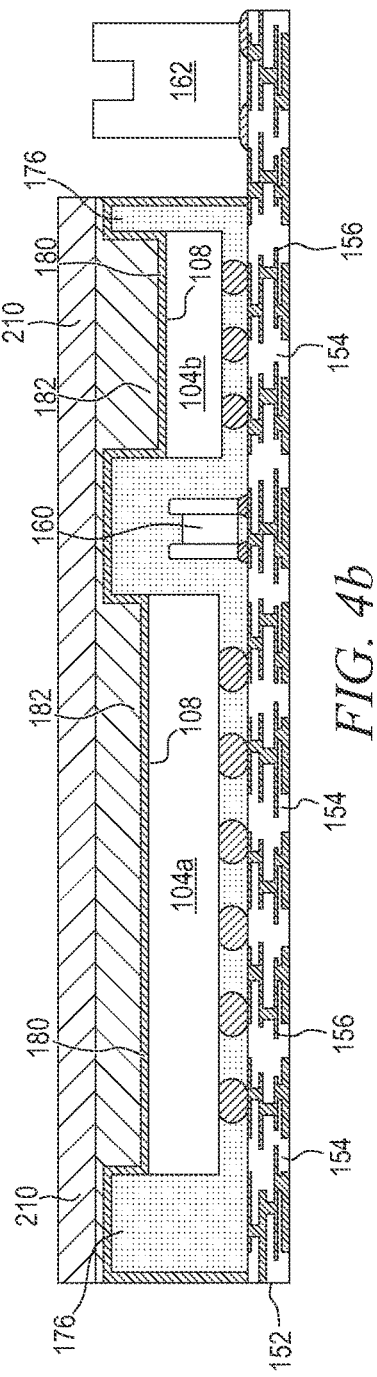

FIGS. 4a and 4b illustrate utilizing a flat heat spreader 210 without stamping. Flat heat spreader 210 remains flat in the final products shown in FIGS. 4a and 4b. TIM 182 completely fills cavities 176 to connect heat spreader 210 to semiconductor die 104. In FIG. 4a, heat spreader 210 still rests directly on shielding layer 180 outside of cavities 178. Optionally, as shown in FIG. 4b, TIM 182 extends across the entire top surface of shielding layer 180 and for the entire footprint of heat spreader 210. TIM 182 is reflowed if necessary to mechanically and thermally connect heat spreader 210 to semiconductor die 104.

Figure 5:
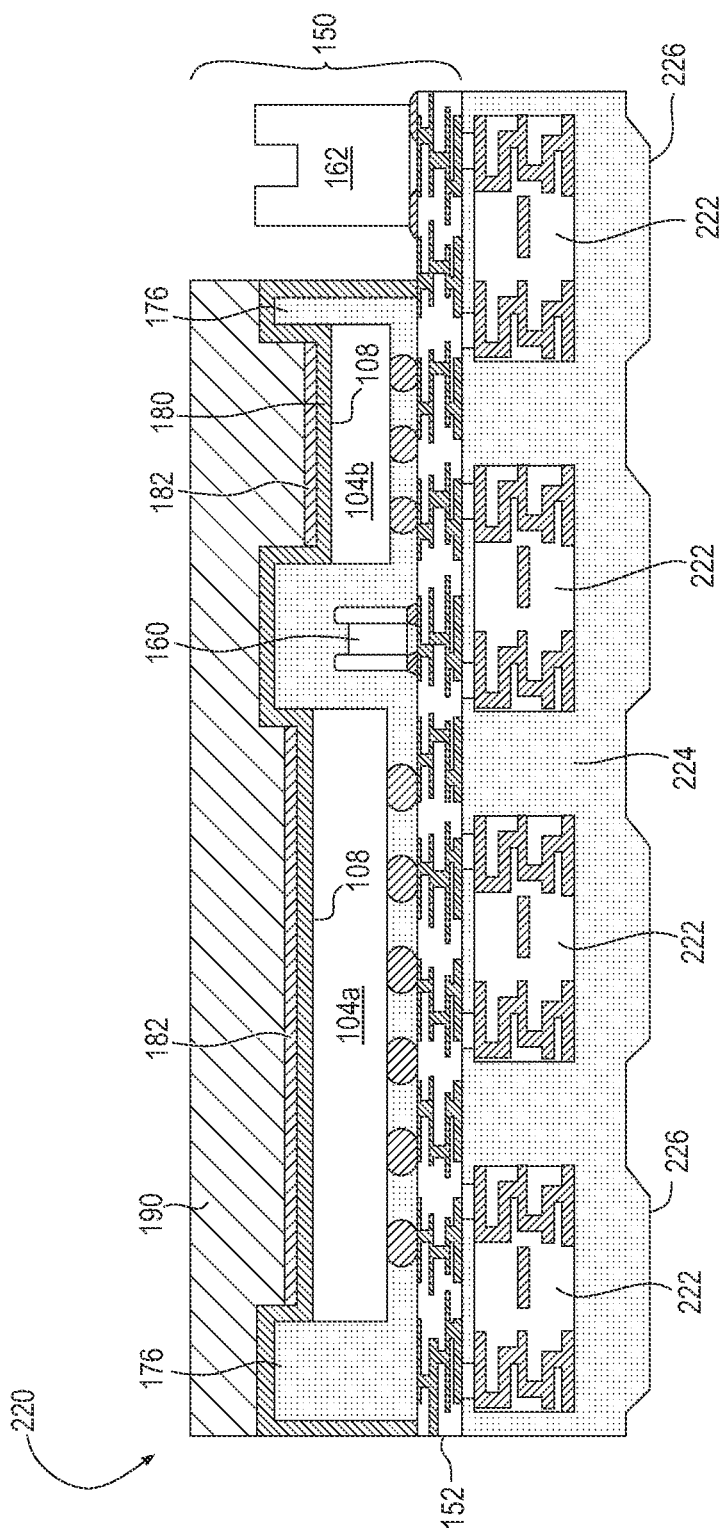
FIG. 5 illustrates an embodiment with an antenna-in-package (AiP) formed using the stepped heat spreader.

FIG. 5 illustrates formation of an antenna-in-package (AiP) module 220 based on SiP module 150. One or more discrete antenna modules 222 are mounted onto the bottom of substrate 152 opposite semiconductor die 104 and then encapsulated with encapsulant 224. Antenna modules 222 are small PCB units with antenna formed as part of conductive layers on or in the PCB. Antenna modules 222 can include, e.g., an antenna formed on one surface and a ground plane formed on the opposite surface.

Encapsulant 224 is similar to encapsulant 176 and formed in a similar manner. Encapsulant 224 is formed with protruding feet 226 to help with mounting AiP module 220 to another substrate of a larger system. In some embodiments, antenna modules 222 and encapsulant 224 fully cover the bottom surface of substrate 152 where interconnect structures might otherwise be formed, so B2B connector 162 is relied upon to connect AiP 220 to external systems. AiP module 220 is a fully integrated antenna and transceiver package that can be incorporated into a mobile device to provide a full implementation of, e.g., 5G communication protocols. Any of the above SiP module and heat spreader embodiments can be used with discrete antenna modules 222 to form AiP module 220.

Figure 6:
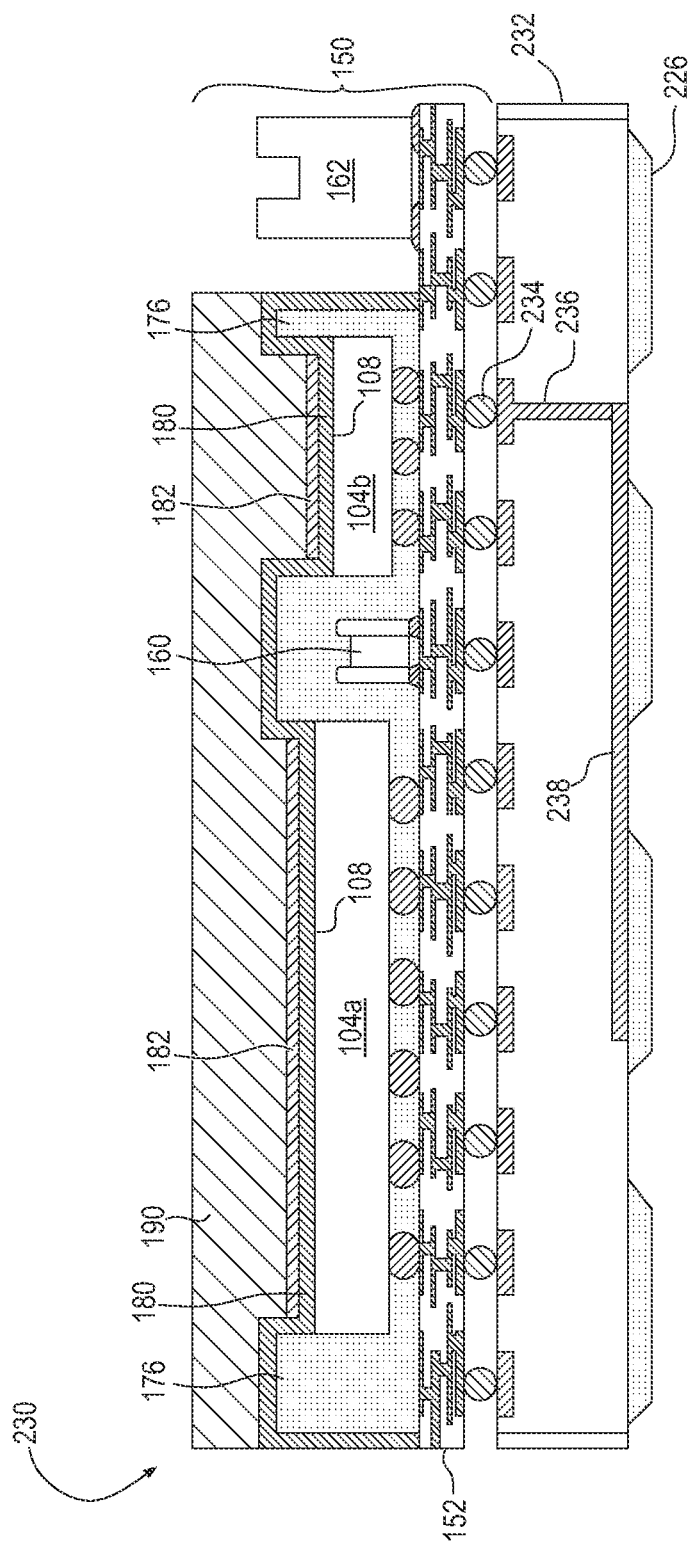
FIG. 6 illustrates a second embodiment with an AiP formed using the stepped heat spreader.

FIG. 6 illustrates an AiP module 230 formed using an antenna substrate 232. Antenna substrate 232 is formed similarly to substrate 152, e.g., with an insulating core and conductive layers patterned on the top and bottom surfaces. Solder bumps 234 are used to mount antenna substrate 232 onto the bottom of SiP module 150. A conductive via 236 formed through antenna substrate 232 electrically couples semiconductor die 104 to antenna 238 patterned on the opposite surface of the antenna substrate. In other embodiments, antenna 238 is embedded within antenna substrate 232 or formed on another surface of the antenna substrate. Feet 226 are molded onto the bottom of antenna substrate 232 as a separate structure after the antenna substrate has already been formed, or antenna substrate 232 can be formed with feet 226 shaped as an inherent part of the substrate. Any of the above SiP module and heat spreader embodiments can be used with substrate 232 to form AiP module 230.

Figure 7:
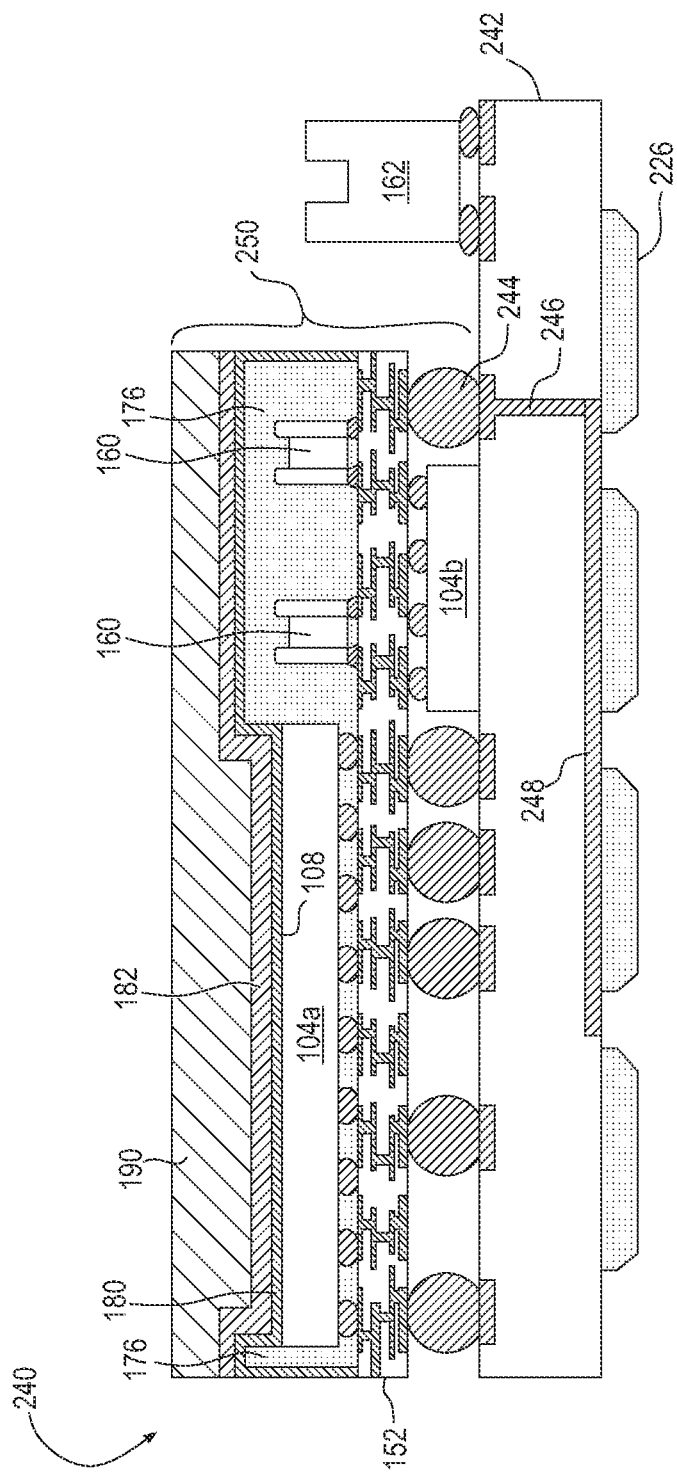
FIG. 7 illustrates a third embodiment with an AiP formed using the stepped heat spreader.

In FIG. 7, AiP module 240 has an antenna substrate 242 that is formed in a similar manner to antenna substrate 232, with conductive via 246 formed through the antenna substrate to couple antenna 248 to the opposite surface. Bumps 244 are used to mount antenna substrate 242 to a SiP module 250. SiP module 250 is similar to, and formed in a similar manner to, SiP module 150 above, but includes a different component configuration. Moreover, B2B connector 162 is disposed on antenna substrate 242 adjacent to SiP module 250 rather than being included as part of the SiP module as above. Any of the above SiP module and heat spreader embodiments can be used with antenna substrate 242 to form AiP module 240. SiP module 250 can be formed using any of the above-described methods adjusted to only a single cavity 178 in encapsulant 176 instead of two cavities.

Figure 8:
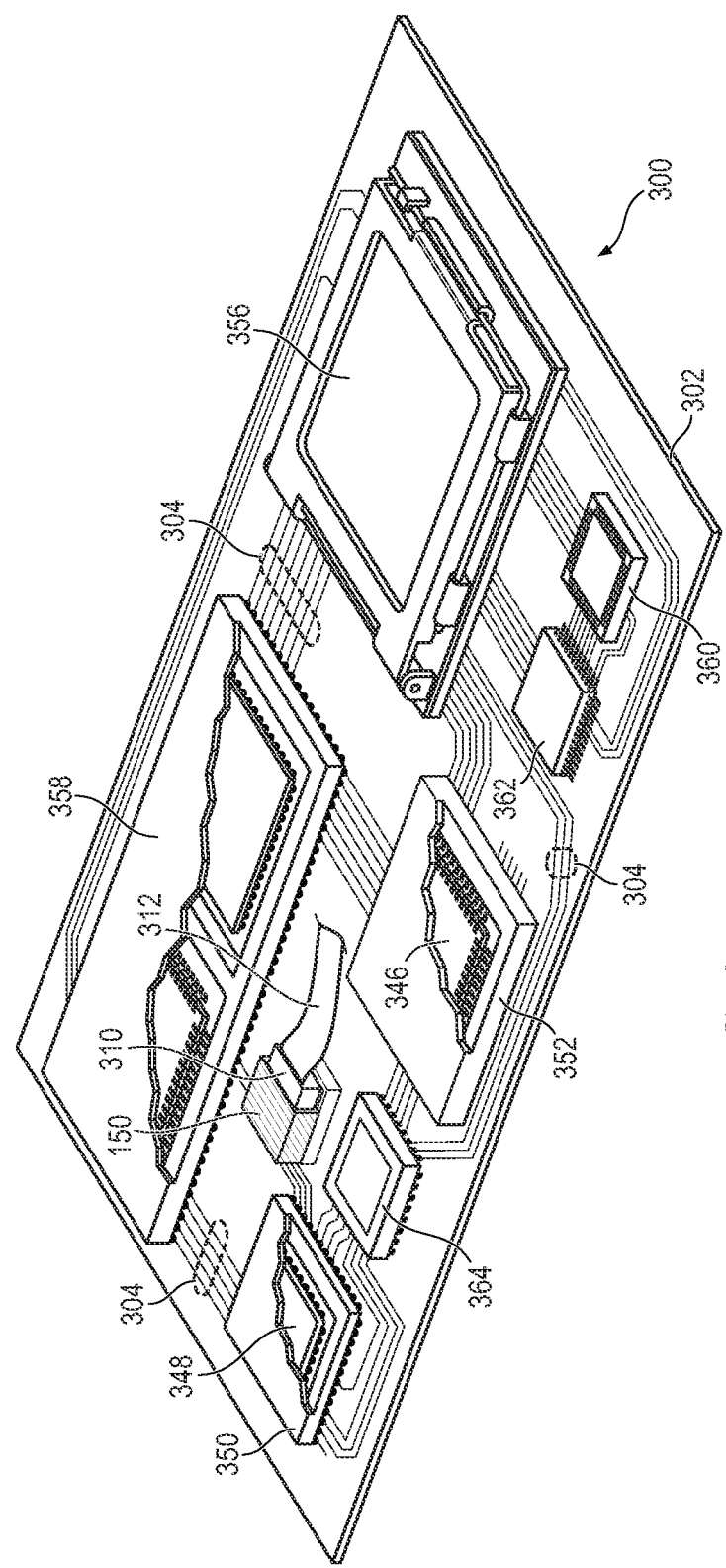
FIG. 8 illustrates integrating the SiP or AiP modules into an electronic device.

FIG. 8 illustrates integrating the above-described semiconductor packages, e.g., SiP module 150, into a larger electronic device 300. One of the SiP modules or AiP modules disclosed above is mounted onto substrate 302 by reflowing solder bumps, using an adhesive that grips onto feet 226, or by another suitable mechanism. Semiconductor die 104 are electrically coupled to conductive traces 304 through substrate 152.

Electronic device 300 includes a PCB or other substrate 302 with a plurality of semiconductor packages mounted on a surface of the PCB, including SiP module 150. Electronic device 300 can have one type of semiconductor package, or multiple types of semiconductor packages, depending on the application. Electronic device 300 can be a stand-alone system that uses the semiconductor packages to perform one or more electrical functions. Alternatively, electronic device 300 can be a subcomponent of a larger system. For example, electronic device 300 can be part of a tablet computer, cellular phone, digital camera, communication system, or other electronic device. Electronic device 300 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

PCB 302 provides a general substrate for structural support and electrical interconnection of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between the semiconductor packages, mounted components, and other external systems or components. Traces 304 also provide power and ground connections to the semiconductor packages as needed.

Solder bumps or another interconnect structure on the bottom of substrate 152 can be used to couple SiP module 150 to PCB 302. A ribbon cable 312 can be attached to B2B connector 162 via connector 310 on the ribbon cable. The ribbon cable can be used to couple SiP module 150 to another area of PCB 302, another part of electronic device 300, to separate diagnostic equipment, or any other desired electronic component or device. In some embodiments, B2B connector 162 is the only external connection to semiconductor die 104 and is relied on entirely to couple the package to substrate 302, e.g., AiP modules 220, 220, and 230. Any of the above-described SiP modules or AiP modules can be incorporated into electronic device 300 in a similar manner.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 302. In other embodiments, a semiconductor device may only have the first level packaging where the die is mechanically and electrically mounted directly to PCB 302.

For the purpose of illustration, several types of first level packaging, including bond wire package 346 and flipchip 348, are shown on PCB 302. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 364 are shown mounted on PCB 302 along with SiP module 150. Conductive traces 304 electrically couple the various packages and components disposed on PCB 302 to SiP module 150, giving use of the components within SiP module 150 to other components on the PCB.

Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate;
   disposing a semiconductor die over the substrate;
   disposing a tape over the semiconductor die;
   depositing an encapsulant over the substrate, semiconductor die, and tape;
   removing the tape to leave a cavity in the encapsulant over the semiconductor die;
   forming a shielding layer over the encapsulant and semiconductor die; and
   disposing a heat spreader over the shielding layer, wherein the heat spreader includes a protrusion extending into the cavity of the encapsulant.

2. The method of claim 1, further including:
   depositing a thermal interface material into the cavity over the shielding layer; and
   disposing the heat spreader with the protrusion contacting the thermal interface material.

3. The method of claim 1, further including disposing an antenna over the substrate opposite the semiconductor die.

4. The method of claim 3, further including depositing a second encapsulant over the antenna.

5. The method of claim 1, further including disposing a board-to-board connector over the substrate.

6. The method of claim 1, further including:
   providing the heat spreader as a flat plate; and
   forming the protrusion by pressing the heat spreader into the cavity.

7. A method of making a semiconductor device, comprising:
   providing a semiconductor die;
   depositing an encapsulant over the semiconductor die with a cavity formed in the encapsulant over the semiconductor die;
   forming a shielding layer over the encapsulant and semiconductor die;
   disposing a thermal interface material into the cavity over the shielding layer; and
   disposing a heat spreader over the shielding layer, wherein the thermal interface material extends from the shielding layer to the heat spreader.

8. The method of claim 7, wherein the heat spreader includes a protrusion extending into the cavity of the encapsulant.

9. The method of claim 7, further including disposing the semiconductor die over an antenna substrate.

10. The method of claim 9, further including disposing a board-to-board connector over the antenna substrate adjacent to the semiconductor die.

11. The method of claim 7, further including forming the cavity in the encapsulant by:
   disposing a tape over the semiconductor die;
   depositing the encapsulant over the tape and semiconductor die; and
   removing the tape after depositing the encapsulant.

12. The method of claim 7, further including pressing the heat spreader into the cavity.

13. A method of making a semiconductor device, comprising:
   providing a substrate;
   disposing a semiconductor die over the substrate;
   disposing a tape over the semiconductor die;
   depositing an encapsulant over the substrate, semiconductor die, and tape;
   removing the tape to leave a cavity in the encapsulant over the semiconductor die; and
   disposing a heat spreader over the semiconductor die, wherein the heat spreader includes a protrusion extending into the cavity of the encapsulant.

14. The method of claim 13, further including:
   depositing a thermal interface material into the cavity; and
   disposing the heat spreader with the protrusion contacting the thermal interface material.

15. The method of claim 13, further including disposing an antenna over the substrate opposite the semiconductor die.

16. The method of claim 15, further including depositing a second encapsulant over the antenna.

17. The method of claim 13, further including disposing a board-to-board connector over the substrate.

18. The method of claim 13, further including:
   providing the heat spreader as a flat plate; and
   forming the protrusion by pressing the heat spreader into the cavity.

19. A method of making a semiconductor device, comprising:
   providing a semiconductor die;
   disposing a tape over the semiconductor die;
   depositing an encapsulant over the semiconductor die and tape;
   removing the tape after depositing the encapsulant to leave a cavity formed in the encapsulant over the semiconductor die, wherein the cavity includes a footprint having substantially the same size and shape as a footprint of the semiconductor die; and
   disposing a heat spreader over the encapsulant and extending into the cavity.

20. The method of claim 19, further including pressing the heat spreader into the cavity.

21. The method of claim 19, further including disposing a thermal interface material into the cavity.

22. The method of claim 19, further including disposing the semiconductor die over an antenna substrate.

23. The method of claim 22, further including disposing a board-to-board connector over the antenna substrate adjacent to the semiconductor die.

* * * * *